United States Patent
Jeong

(10) Patent No.: US 9,583,152 B1
(45) Date of Patent: Feb. 28, 2017

(54) LAYOUT OF SEMICONDUCTOR MEMORY DEVICE INCLUDING SUB WORDLINE DRIVER

(71) Applicant: SK hynix Inc., Icheon-si, Gyeonggi-do (KR)

(72) Inventor: Jae Hong Jeong, Yongin-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 15/019,081

(22) Filed: Feb. 9, 2016

(30) Foreign Application Priority Data

Sep. 25, 2015 (KR) .................. 10-2015-0136446

(51) Int. Cl.

| G11C 11/34 | (2006.01) |
|---|---|
| G11C 5/02 | (2006.01) |
| G11C 8/08 | (2006.01) |
| G11C 5/06 | (2006.01) |
| H01L 23/528 | (2006.01) |
| H01L 27/02 | (2006.01) |
| H01L 27/092 | (2006.01) |
| H01L 27/105 | (2006.01) |

(52) U.S. Cl.
CPC .............. *G11C 5/025* (2013.01); *G11C 5/063* (2013.01); *G11C 8/08* (2013.01); *H01L 23/528* (2013.01); *H01L 27/0207* (2013.01); *H01L 27/092* (2013.01); *H01L 27/105* (2013.01)

(58) Field of Classification Search
CPC ................ G11C 8/14; G11C 8/08; G11C 8/10
USPC ........................................ 365/185.23, 230.06
See application file for complete search history.

(56) References Cited

U.S. PATENT DOCUMENTS

| 2001/0013659 A1* | 8/2001 | Noda ........................ G11C 7/18 257/758 |
|---|---|---|
| 2006/0098469 A1* | 5/2006 | Yang ...................... G11O 5/063 365/63 |
| 2011/0032786 A1 | 2/2011 | Yang et al. |
| 2012/0193720 A1* | 8/2012 | Han .................. H01L 27/10891 257/368 |

FOREIGN PATENT DOCUMENTS

| KR | 1020110015803 A | 2/2011 |
|---|---|---|
| KR | 1020140071066 A | 6/2014 |

* cited by examiner

*Primary Examiner* — Han Yang
(74) *Attorney, Agent, or Firm* — William Park & Associates Ltd.

(57) ABSTRACT

A layout structure of a semiconductor memory device including a sub wordline driver is disclosed. The semiconductor memory device layout having a sub wordline driver in which a PMOS region is located includes: a plurality of active regions; and a main word line formed to pass through the active regions. The main word line includes three gate lines.

20 Claims, 9 Drawing Sheets

FIG.3

LAYOUT OF SEMICONDUCTOR MEMORY DEVICE INCLUDING SUB WORDLINE DRIVER

CROSS-REFERENCE TO RELATED APPLICATION

The priority of Korean patent application No. 10-2015-0136446 filed on 25 Sep. 2015, the disclosure of which is hereby incorporated in its entirety by reference, is claimed.

BACKGROUND OF THE INVENTION

1. Technical Field

Embodiments of the present disclosure relate to a layout structure of a semiconductor memory device including a sub wordline driver.

2. Related Art

A semiconductor memory device may write or read data in or from memory cells coupled to word lines and bit lines. The memory cells coupled to the word lines may form one row such that the respective memory cells can operate according to a voltage applied to the word lines.

With increasing storage capacity of semiconductor memory devices, a speed delay problem has arisen in which a word line voltage applied to one word line is applied to a plurality of memory cells.

In order to address the speed delay problem, there has been proposed an improved scheme in which one word line is divided into a plurality of sub wordlines and each sub wordline is driven by a sub wordline driver (SWD).

BRIEF SUMMARY OF THE INVENTION

Various embodiments of the present disclosure are directed to providing a layout structure of a semiconductor memory device including a sub wordline driver (SWD) that substantially obviates one or more problems due to limitations and disadvantages of the related art.

The embodiments of the present disclosure relate to a layout structure of a semiconductor memory device including a sub wordline driver configured to minimize the size of an increased region in a sub wordline driver region as well as to guarantee a space margin between a metal contact and a gate line.

The main word line is formed in a line shape extended in a first direction.

The active region includes: a first active region in which a first portion having a first critical dimension is coupled to a second portion having a second critical dimension smaller than the first critical dimension; and a second active region having a third critical dimension, wherein the first critical dimension, the second critical dimension, and the third critical dimension indicate a critical dimension of a second direction perpendicular to an extended direction of the main word line.

The first active region and the second active region are spaced apart from each other by a predetermined distance so as to make one pair of active regions, wherein the second active region is adjacent to the first portion of the first active region in a first direction, and the second active region is adjacent to the second portion of the first active region in a second direction.

In association with one pair of active regions including the first active region and the second active region and the other pair of active regions adjacent to the pair of the first and second active regions, the first active region and the second active region are symmetrically arranged in up, down, left and right directions, in a vertical direction, or in a horizontal direction.

A third active region having a fourth critical dimension larger than the second critical dimension, configured to be arranged not only on one side of the one pair of active regions but also on the other side of the other pair of active regions.

The first portion of the first active region is arranged in a manner that three gate lines pass through the first portion.

A metal contact is disposed over the first active region arranged at both sides of the three gate lines.

The first active region includes two transistors.

The two transistors share the metal contact arranged over the first active region disposed between the first main word line and the second main word line.

The second active region and the third active region are arranged in a manner that two gate lines pass through the second and third active regions.

A metal contact is arranged at both sides of the two gate lines of the second active region and the third active region.

The main word line on the same column includes: a first main word line in which one or two gate lines are formed in a fingered shape; and a second main word line in which one or two gate lines are formed in a fingered shape.

A metal contact disposed over the active regions arranged at both sides of the gate line.

In accordance with an aspect of the present disclosure, a semiconductor memory device layout having a sub wordline driver in which a PMOS region is located comprising: a first active region and a second active region, each of which is shaped in a bar shape; and a first main word line and a second main word line formed to pass through the first active region and the second active region, wherein each of the first main word line and the second main word line is formed in a fingered shape of one or two gate lines.

The first active region and the second active region are spaced apart from each other by a predetermined distance.

Each of the first main word line and the second main word line in the first active region and the second active region is formed in a fingered shape of one or two gate lines.

A third active region formed at one side of each of the first active region and the second active region; and a first main word line formed to pass through the third active region, wherein the first main word line is formed in a fingered shape of two gate lines.

Eight transistors are arranged in the semiconductor device.

An NMOS region including eight metal contact disposed on both sides of the first and second main word line.

It is to be understood that both the foregoing general description and the following detailed description are exemplary and explanatory and are intended to provide further explanation of the claims.

BRIEF DESCRIPTION OF THE DRAWINGS

FIG. 3 is a layout diagram illustrating a relationship of arrangement of a cell mat region and a sub wordline driver (SWD) region.

DESCRIPTION OF EMBODIMENTS

Reference will now be made in detail to certain embodiments, examples of which are illustrated in the accompanying drawings. Wherever possible, the same reference numbers will be used throughout the drawings to refer to the same or like parts. In the following description, a detailed description of related known configurations or functions incorporated herein will be omitted when it may make the subject matter less clear.

Figure 1:
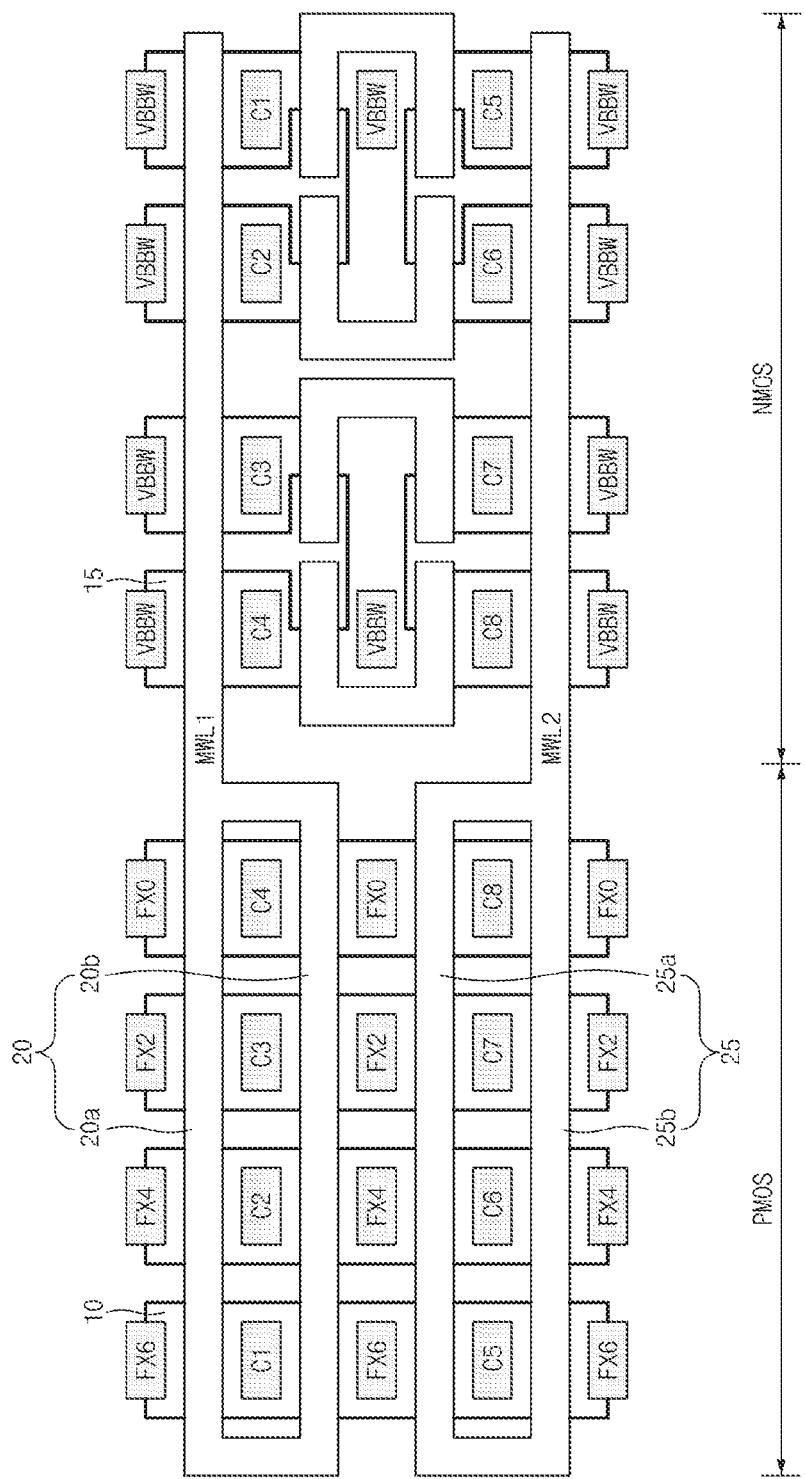
FIG. 1 is a layout diagram illustrating a conventional sub wordline driver (SWD) region.

FIG. 1 is a layout diagram illustrating a conventional sub wordline driver (SWD) region.

Referring to FIG. 1, the sub wordline driver (SWD) may include a plurality of active regions (10, 15) in a PMOS region and an NMOS region. The active region 10 of the PMOS region may be formed in a bar shape, and the active region 15 of the NMOS region may be formed in a specific shape in which the center parts of two neighbor active regions are coupled to each other.

Two main word lines (MWL1; 20, MWL2; 25) may be formed to pass through the active regions (10, 15).

The main word line may include a first main word line 20 and a second main word line 25. The first main word line 20 may be formed in a fingered structure with two gate lines (20a, 20b) with gate line 20a as one finger and gate line 20b as another finger. The second main word line 25 may also be formed in a fingered structure with two gate lines (25a, 25b).

That is, four gate lines (20a, 20b, 25a, 25b) may be arranged in one sub wordline driver (SWD).

Metal contacts (C1~C8) and metal contacts (FX0, FX2, FX4, FX6) may be arranged at both sides of the gate lines (20a, 20b, 25a, 25b).

However, as device size is gradually reduced, a pitch of a sub word line is also gradually reduced in the structure of FIG. 1. As a result, a space margin between the gate line and the metal contact is reduced, resulting in the occurrence of a not-open state in which the contact is not completely opened. The structure of FIG. 2 is proposed to address the above-mentioned issue.

Figure 2:
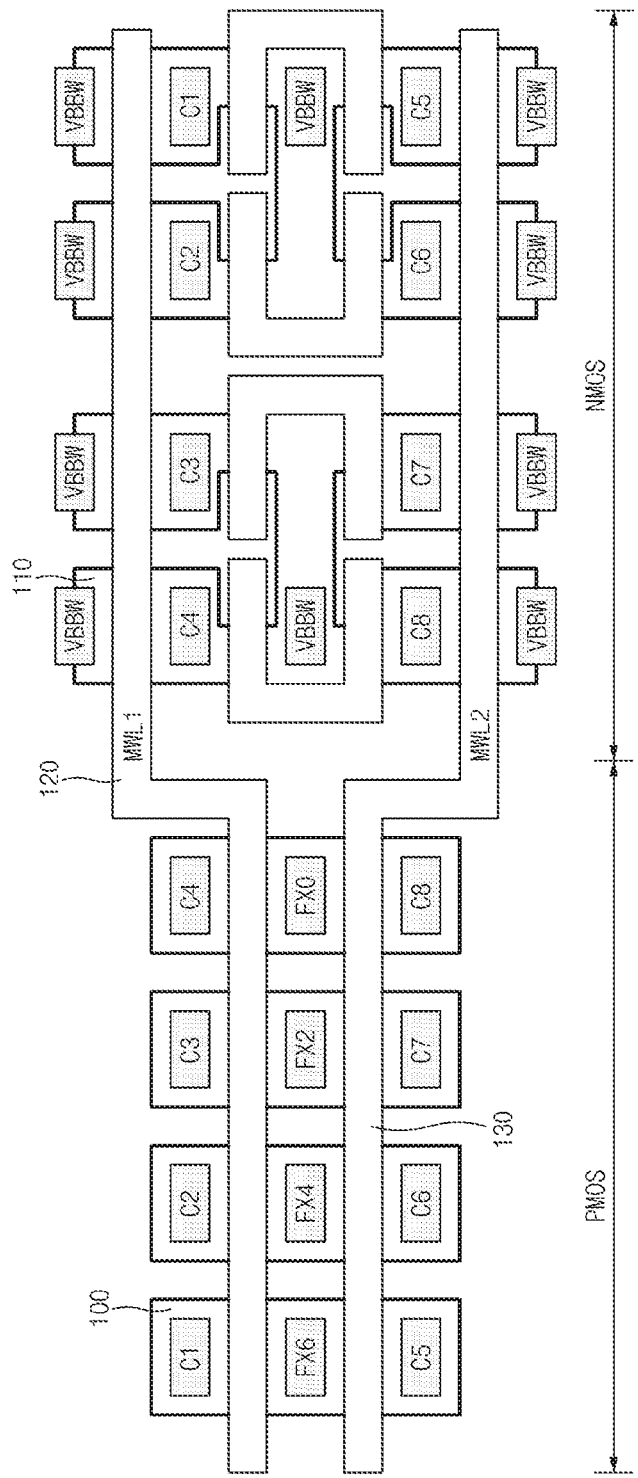
FIG. 2 is a layout diagram illustrating a sub wordline driver (SWD) region including a modified gate structure to address the issues of FIG. 1.

FIG. 2 is a layout diagram illustrating a sub wordline driver (SWD) region including a modified gate structure to address the issues of FIG. 1. Referring to FIG. 2, the sub wordline driver (SWD) may include a plurality of active regions (100, 110) in a PMOS region and an NMOS region, and two main word lines (MWL1, MWL2) may be arranged to pass through the active regions (100, 110). The two main word lines may include a gate line 120 and a gate line 130, respectively.

Metal contacts (C1~C8) and metal contacts (FX0, FX2, FX4, FX6) may be arranged at both sides of the gate lines (120, 130).

If the same PMOS size is achieved in the above structure, a size of a necessary region in FIG. 2 needs to be double that of the structure of the FIG. 1.

Therefore, assuming that four gate lines are arranged in one sub wordline driver (SWD), a space margin between the gate line and the metal contact becomes sufficient in size.

In addition, assuming that two gate lines are arranged in one sub wordline driver (SWD) to address the above-mentioned issue, the sub wordline driver (SWD) region needs to be doubled, resulting in an increased net die.

Figure 3:
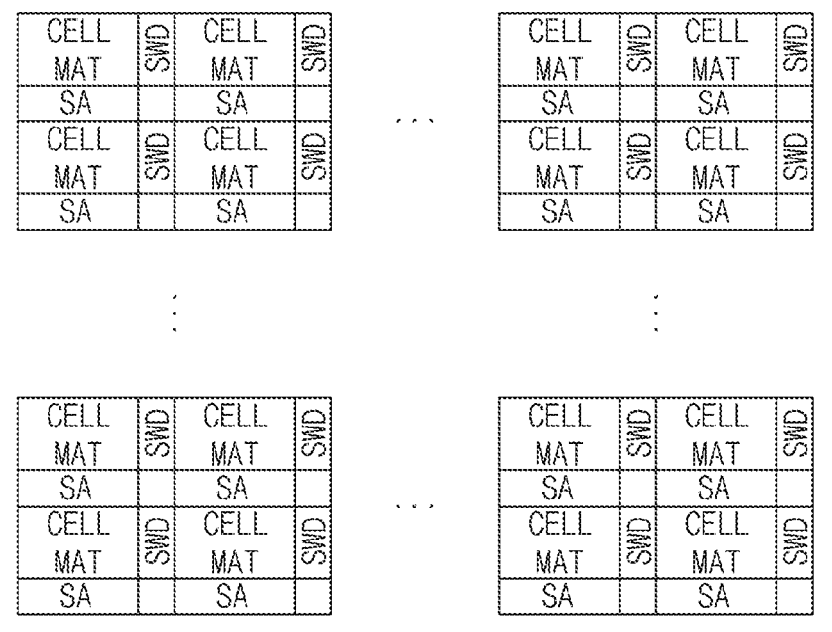

FIG. 3 is a layout diagram illustrating a relationship of an arrangement of a cell mat region and a sub wordline driver (SWD) region.

Referring to FIG. 3, a plurality of cell mats may be arranged in vertical and horizontal directions.

The sub wordline driver (SWD) may be arranged between two neighbor cell mats arranged in the horizontal direction. The sub wordline driver (SWD) may drive the sub word line in response to an input signal received through the main word line (MWL) and output signals of the word line enable driver (PXi Driver).

In addition, a sense amplifier (SA) may be disposed between two neighbor cell mats arranged in a vertical direction. The sense amplifiers may sense and amplify data of bit lines arranged in the corresponding cell array. That is, the sense amplifiers may detect and amplify data of a selected memory cell (MC).

Figure 4A:
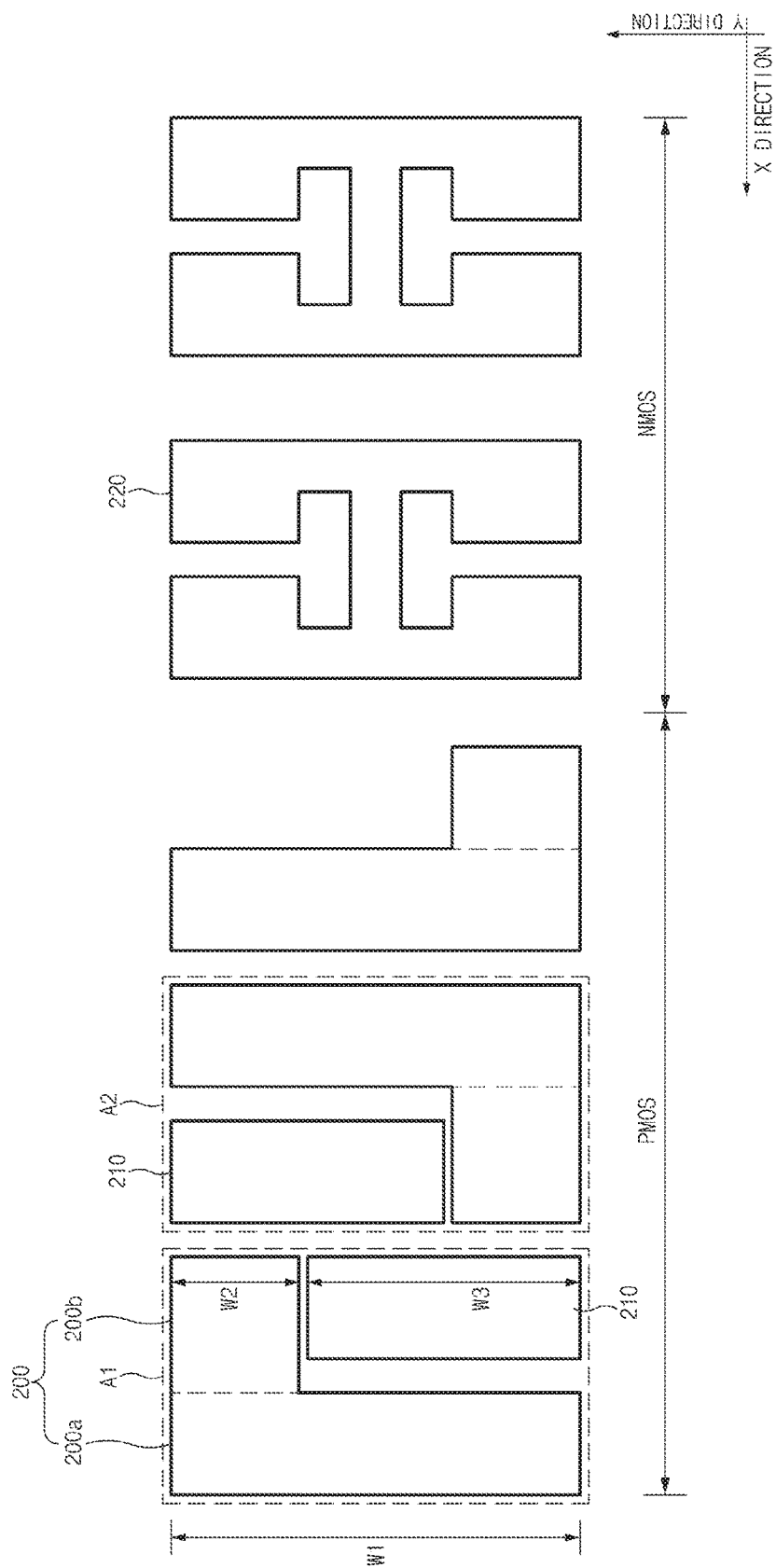
FIGS. 4A, 4B, and 4C are layout diagrams illustrating a sub wordline driver (SWD) region according to an embodiment of the present disclosure.
Figure 4B:
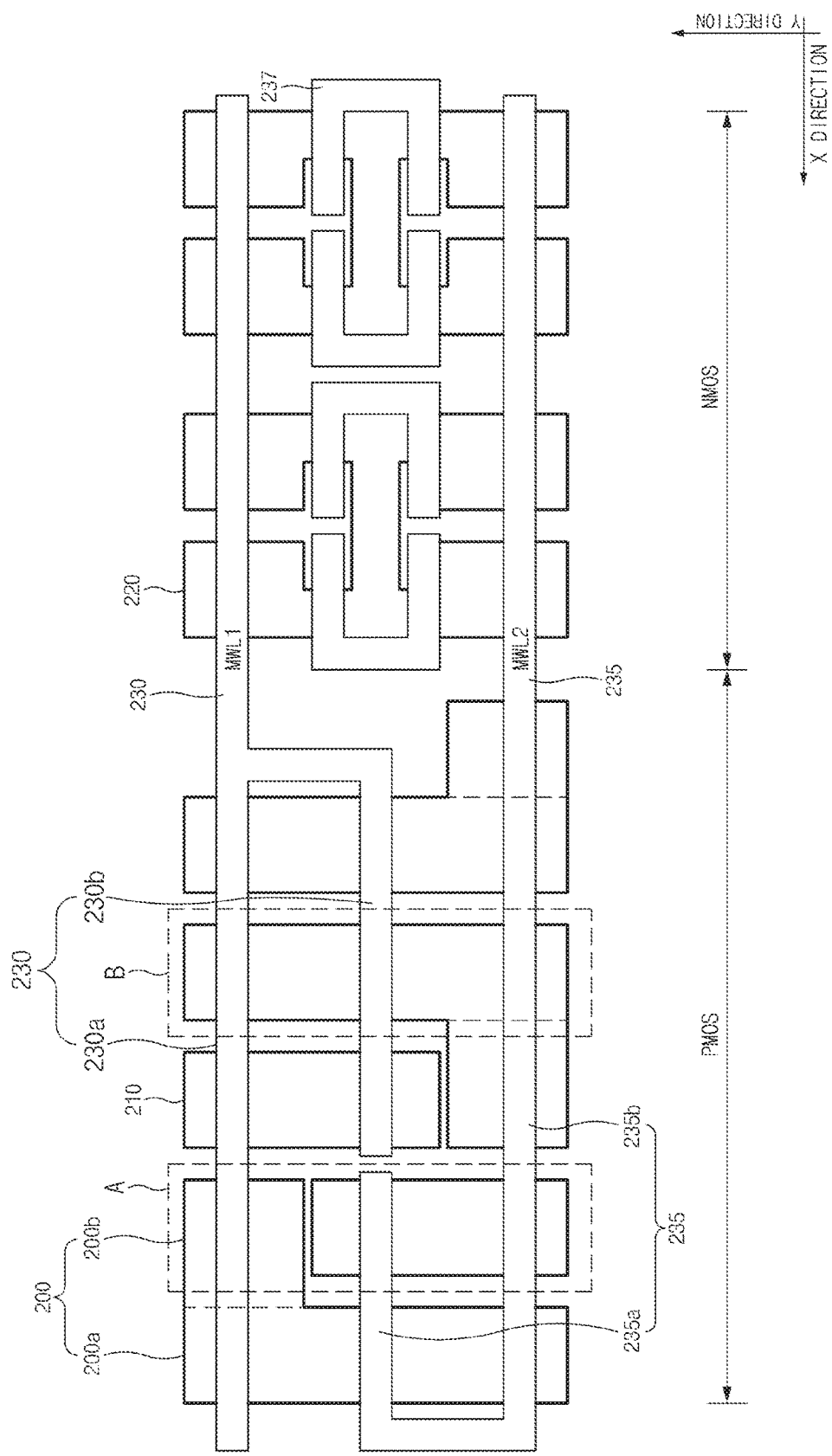
Figure 4C:
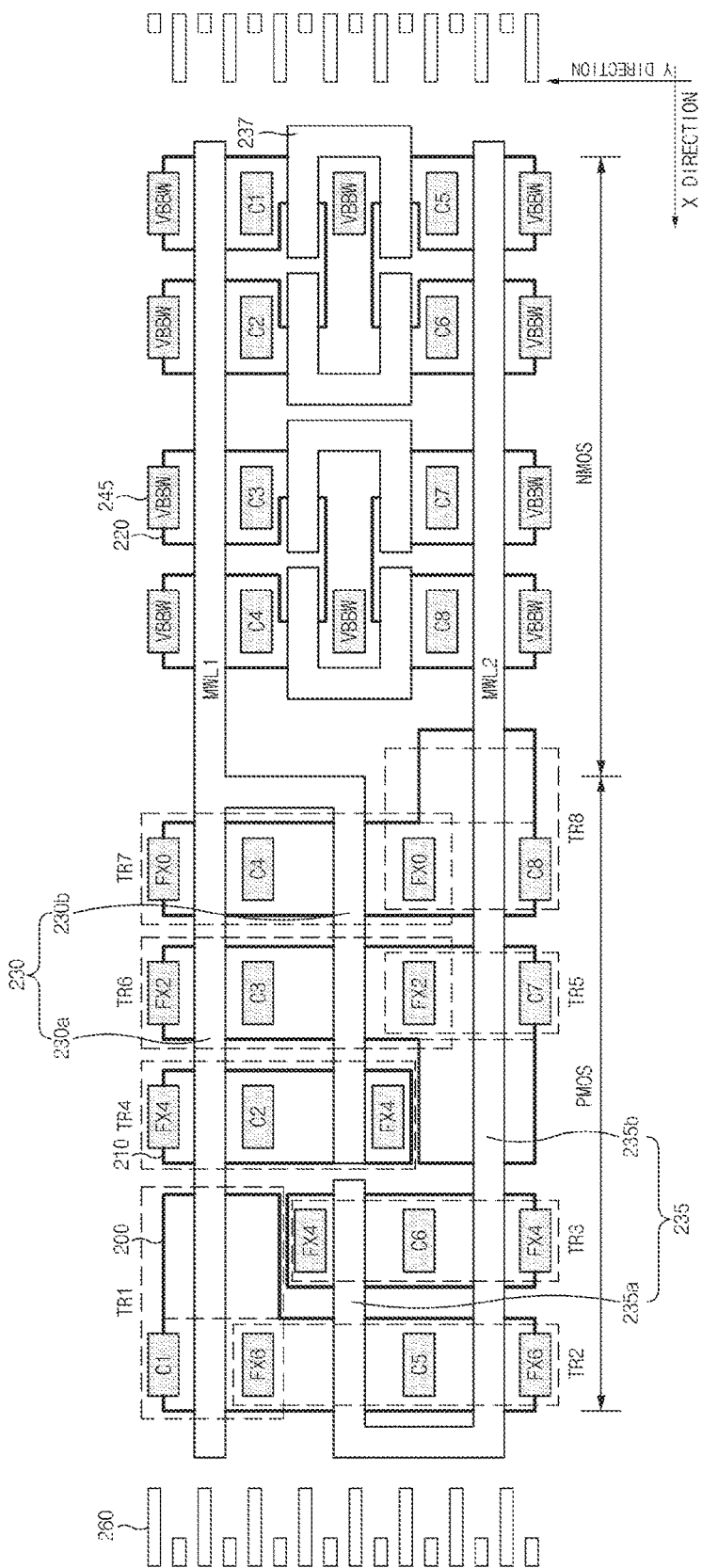

FIGS. 4A to 4C are layout diagrams illustrating a sub wordline driver (SWD) according to an embodiment of the present disclosure.

The sub wordline driver (SWD) may include a PMOS region and an NMOS region, and each of the PMOS region and the NMOS region may include a plurality of active regions, a plurality of main word lines, and a plurality of metal contacts.

FIG. 4A illustrates the active regions arranged in the sub wordline driver (SWD), and the shape and arrangement structure of the active regions will hereinafter be described with reference to FIG. 4A.

The plurality of active regions arranged in the PMOS region may include a first active region 200 and a second active region 210 spaced apart from each other a predetermined distance, which may be shaped in a bar shape. The separation between the first active region 200 and the second active region 210 is not limited thereto, and different distances may also be used in respective separations without departing from the scope or spirit of the present disclosure.

The first active region 200 may include a first portion 200a having a first critical dimension W1 coupled to a second portion 200b having a second critical dimension W2 smaller than the first critical dimension W1. The first active region 200 may be formed from a connection shape of the first portion 200a and the second portion 200b. In this case, one side of the first portion 200a and one side of the second portion 200b in the first active region 200 may be arranged at a same line extended in the first direction (X direction). That is, each side of the first and second portions (200a, 200b) may be shaped in a '⌐' or '⌊' shape as shown in FIG. 4A.

In addition, the second active region 210 may be formed to have a third critical dimension W3 smaller than the first critical dimension W1. The third critical dimension W3 may be larger than the second critical dimension W2 corresponding to the critical dimension of the second portion 200b.

In this case, the first critical dimension W1 and the second critical dimension W2 of the first active region 200 and the third critical dimension W3 of the second active region 210 may indicate a critical dimension of the second direction (Y direction) shown in FIG. 4A perpendicular to an extended direction of main word lines (MWL1 and MWL2).

The second active region 210 may be adjacent to the first portion 200a of the first active region 200 in the first direction, and the second active region 210 may be adjacent to the second portion 200b of the first active region 200 in the second direction (Y direction). That is, the second active region 210 may be arranged in an angled portion of the first active region 200.

Assuming that one first active region 200 and one second active region 210 construct one pair A1 of active regions, one pair A1 of the active regions may be spaced apart from the other pair A2 of active regions by a predetermined distance so as to make one pair of active regions.

One pair A1 of active regions and the other pair A2 of active regions, adjacent to the active regions A1, may be symmetrically arranged in an up, down, left and right directions, and a vertical direction or a horizontal direction. The arrangement structure of active regions is not limited thereto, and the active regions can be freely arranged in a predetermined range which takes-up a same-sized region.

Meanwhile, a plurality of third active regions 220, each of which has a first critical dimension W1, may be spaced from each other by a predetermined distance in the first direction, such that the NMOS region is achieved. Two third active regions 220 adjacent to each other may each be interconnected at the center part.

FIG. 4B is a layout diagram illustrating a plurality of main word lines (MWL) disposed over the active regions shown in FIG. 4A.

Referring to FIG. 4B, a plurality of main word lines (MWL) may be disposed to pass through the first active region 200 and the second active region 210 of the PMOS region and the third active region 220 of the NMOS region. The third active region 220 may be formed at one side each of the first active region 200 and the second active region 210. The main word lines (MWL) may be formed in a line shape extended in the first direction. The plurality of main word lines (MWL) may include the first main word line (MWL1; 230) and the second main word line (MWL2; 235).

Each of the first main word line 230 and the second main word line 235 may be formed in a fingered structure of one or two gate lines. The first main word line 230 and the second main word line 235 may include both a fingered portion comprised of one gate line and a fingered portion comprised of two gate lines.

Since three gate lines of the embodiment are arranged to pass through the sub wordline driver (SWD) region, a total number of gate lines formed in a fingered shape in the first main word line 230 and the second main word line 235 located at a same column may be set to three.

A relationship among the main word lines and the gate lines will hereinafter be described with reference to 'A' and 'B' of FIG. 4B.

Referring to 'A' of FIG. 4B, assuming that one first gate line 230a is formed in fingered shape representing one finger in the first main word line 230 in a same column, the second main word line 235 may be arranged in a manner that two gate lines (i.e., a first gate line 235a, one finger, and a second gate line 235b, an other finger) are formed in a fingered shape. Further, the first portion 200A of the first active region 200 may be arranged in a manner that three gate lines (230A, 235A, 235B) pass through the first portion 200A.

Referring to 'B' of FIG. 4B, assuming that two gate lines (i.e., a first gate line 230a and a second gate line 230b) are formed in a fingered shape in the first main word line 230, the second main word line 235 may be arranged in a manner that one first gate line 230a is formed in a fingered shape.

One gate line may be formed in a fingered shape in a predetermined portion of the first main word line 230 and the second main word line 235, and two gate lines may be fingered in another portion thereof.

Since two gate lines are formed in a fingered shape in each of two main word lines according to the related art, a total of four gate lines may be arranged to pass through one sub wordline driver (SWD).

However, since one or two gate lines are partially formed in a fingered shape in two main word lines according to an embodiment, a total of three gate lines may be arranged to pass through one sub wordline driver (SWD). Therefore, it may be possible to guarantee a space margin between gate lines and metal contacts to be arranged in a subsequent process.

The first main word line (MWL1; 230) and the second main word line (MWL2; 235) arranged to pass through the third active region 220 may be contained in the NMOS region. In one example, the second active region 210 and the third active region 220 are arranged such that the two gate lines, for example 220A, 235B pass through the second and third active regions 210, 220. The first main word line 230 and the second main word line 235 in the NMOS region may be extended from the first main word line 230 and the second main word line 235 of the PMOS region, respectively.

In addition, the '⊏'-shaped word line 237 may be added between the first main word line 230 and the second main word line 235 in the NMOS region. The word line 237 may be disposed over the third active region 220, and neighbor word lines 237 may be spaced apart from each other by a predetermined distance in the first direction. Two neighbor word lines 237 may be horizontally symmetrical to each other.

FIG. 4C is a layout diagram illustrating a plurality of metal contacts added to the layout diagram of FIG. 4B.

Referring to FIG. 4C, a plurality of metal contacts may be arranged over the first active region 200 and the second active region 210 located at both sides of the first gate line 230a and the second gate line 230b of the first main word line 230.

In addition, a plurality of metal contacts may also be arranged over the first active region 200 and the second active region 210 located on both sides of the first gate line 235a and the second gate line 235b of the second main word line 235.

The plurality of metal contacts will hereinafter be described in detail. A metal contact C1, a metal contact FX4, a metal contact FX2, and a metal contact FX0 may be arranged on one side of the first gate line 230a of the first main word line 230. In addition, a metal contact FX6, a metal contact C2, a metal contact C3, and a metal contact C4 may be arranged to respectively correspond to the metal contact C1, the metal contact FX4, the metal contact FX2, and the metal contact FX0 based on the first gate line 230a of the first main word line 230.

In addition, a metal contact C5, a metal contact C6, a metal contact FX2, and a metal contact FX0 may be arranged on one side of the second gate line 235b of the second main word line 235. In addition, a metal contact FX6, a metal contact FX4, a metal contact C7, and a metal contact C8 may be arranged to respectively correspond to the metal contact C5, the metal contact C6, the metal contact FX2, and the metal contact FX0 based on the second gate line 235b of the second main word line 235.

In addition, the metal contact FX4 may be arranged not only on one side of the first gate line 230a of the first main word line 230 passing through the second active region 210, but there may also be a metal contact FX4 on the other side of the second gate line 235b of the second main word line 235.

The metal contacts (C1~C8) may be coupled to respective sub word lines 260, and the metal contacts (FX0~FX6) may be coupled to output signals of the sub word lines. Although the connection relationship between sub word lines and metal contacts will be omitted to more clearly illustrate arrangement of the gate lines for convenience of description, the sub word lines 260 may be arranged to respectively connect to metal contacts (C1~C8).

A total of eight transistors may be arranged in the sub wordline driver (SWD), and some of the eight transistors may share a metal contact and thus serve as a transistor.

For example, a first transistor TR1 may include a first gate line 230a of a first main word line 230 passing through a first active region 200, and a metal contact C1 and a metal contact FX6 arranged at both sides of the first gate line 230a.

A second transistor TR2 may include a metal contact FX6, a metal contact C5, and a metal contact FX6, which are arranged at both sides of a first gate line 235a and a second gate line 235b of a second main word line 235 passing through the first active region 200. In this case, the first transistor TR1 and the second transistor TR2 may share the metal contact FX6 disposed between the first main word line 230 and the second main word line 235.

A third transistor TR3 may include a second main word line 235 passing through the second active region 210, a metal contact C6, and metal contacts FX4.

A fourth transistor TR4 may include the first main word line 230 passing through the second active region 210, a metal contact C2, and metal contacts FX4.

A fifth transistor TR5, a sixth transistor TR6, a seventh transistor TR7, and an eighth transistor TR8 may include the same constituent elements as the first to fourth transistors (TR1~TR4), and as such a detailed description thereof will herein be omitted for convenience of description. In one example, at least one metal contact (C1~C8, FX0~FX6) may be disposed over a first active region 200 arranged at both sides of the three gate lines 230A, 235A, 235B. In another example, at least one metal contact (C1~C8, FX0~FX6) may be disposed over a first active region 200 arranged at both sides of three different gate lines 230A, 230B, 235B.

In addition, the NMOS region may include metal contacts (VBBW) and metal contacts (C1~C8) disposed at both sides of the first main word line 230 and the second main word line 235. In addition, additional metal contacts (VBBW) may also be arranged in the word line 237 located between the first main word line 230 and the second main word line 235.

As described above, a conventional sub wordline driver (SWD) structure through which four gate lines pass is modified into another sub wordline driver (SWD) structure through which three gate lines pass, such that a larger-sized space between gate lines and metal contacts can be guaranteed as compared to the conventional sub wordline driver (SWD) structure.

Figure 5A:
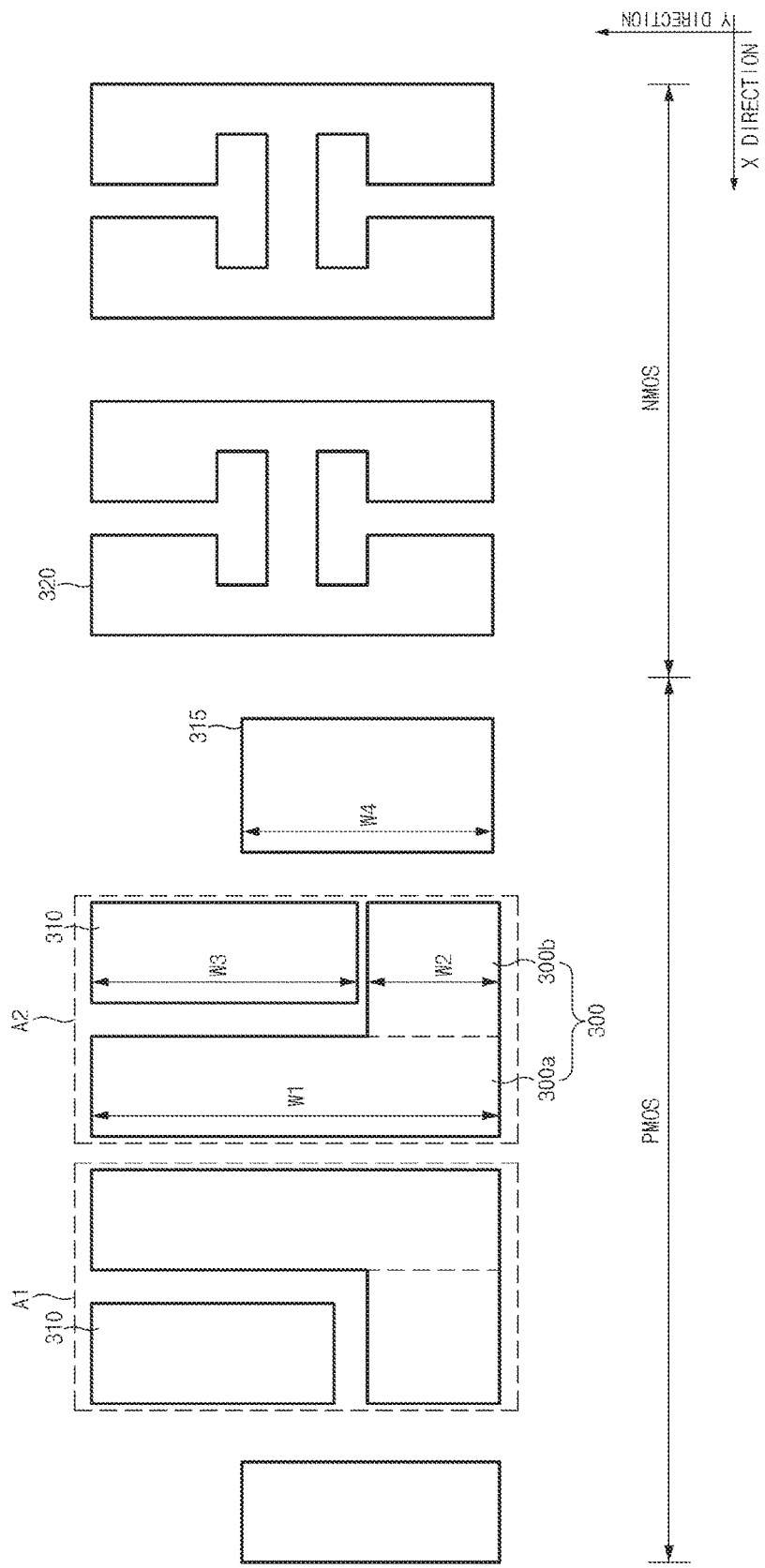
FIGS. 5A, 5B, and 5C are layout diagrams illustrating a sub wordline driver (SWD) region according to another embodiment of the present disclosure.
Figure 5B:
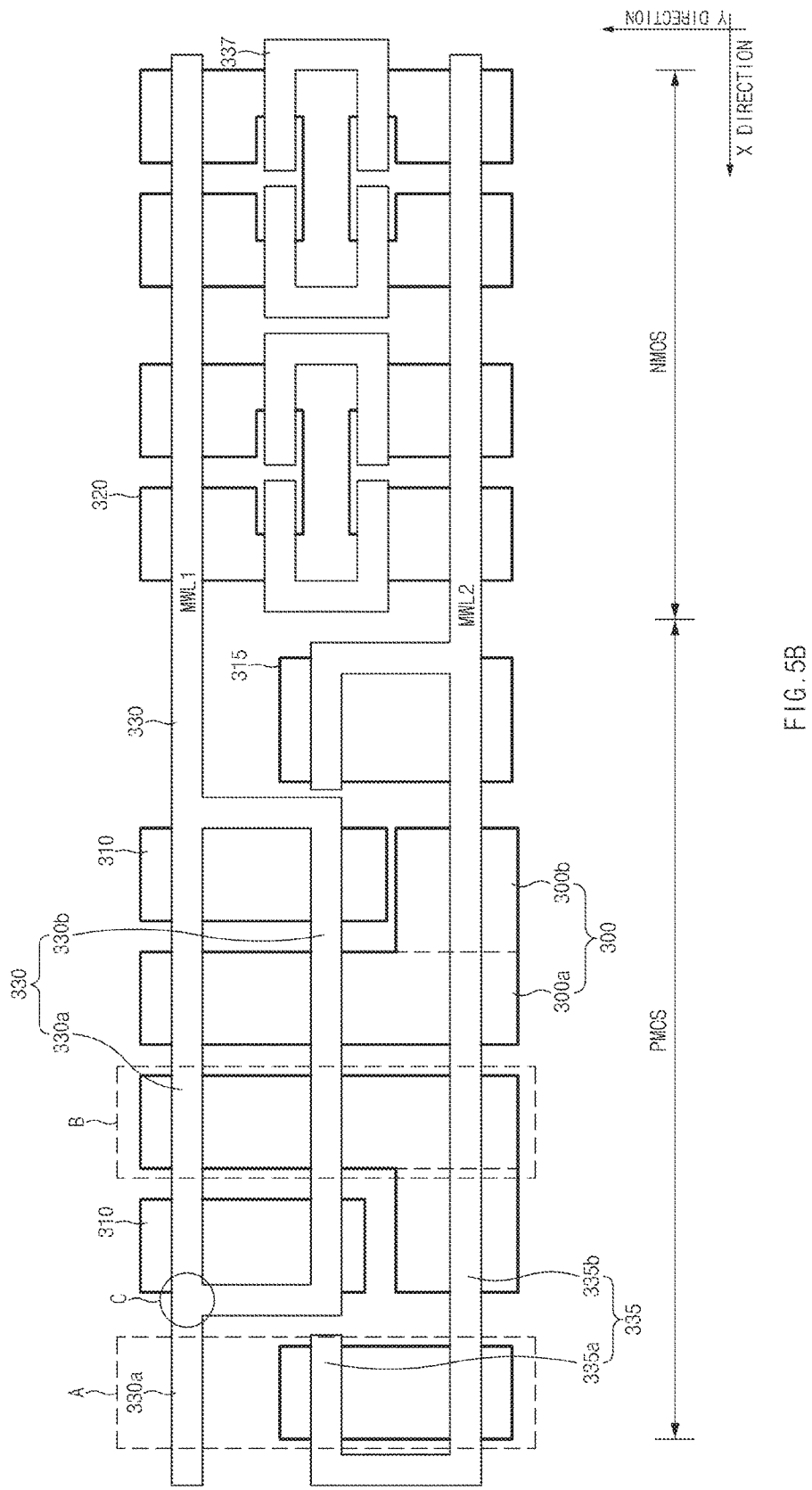
Figure 5C:
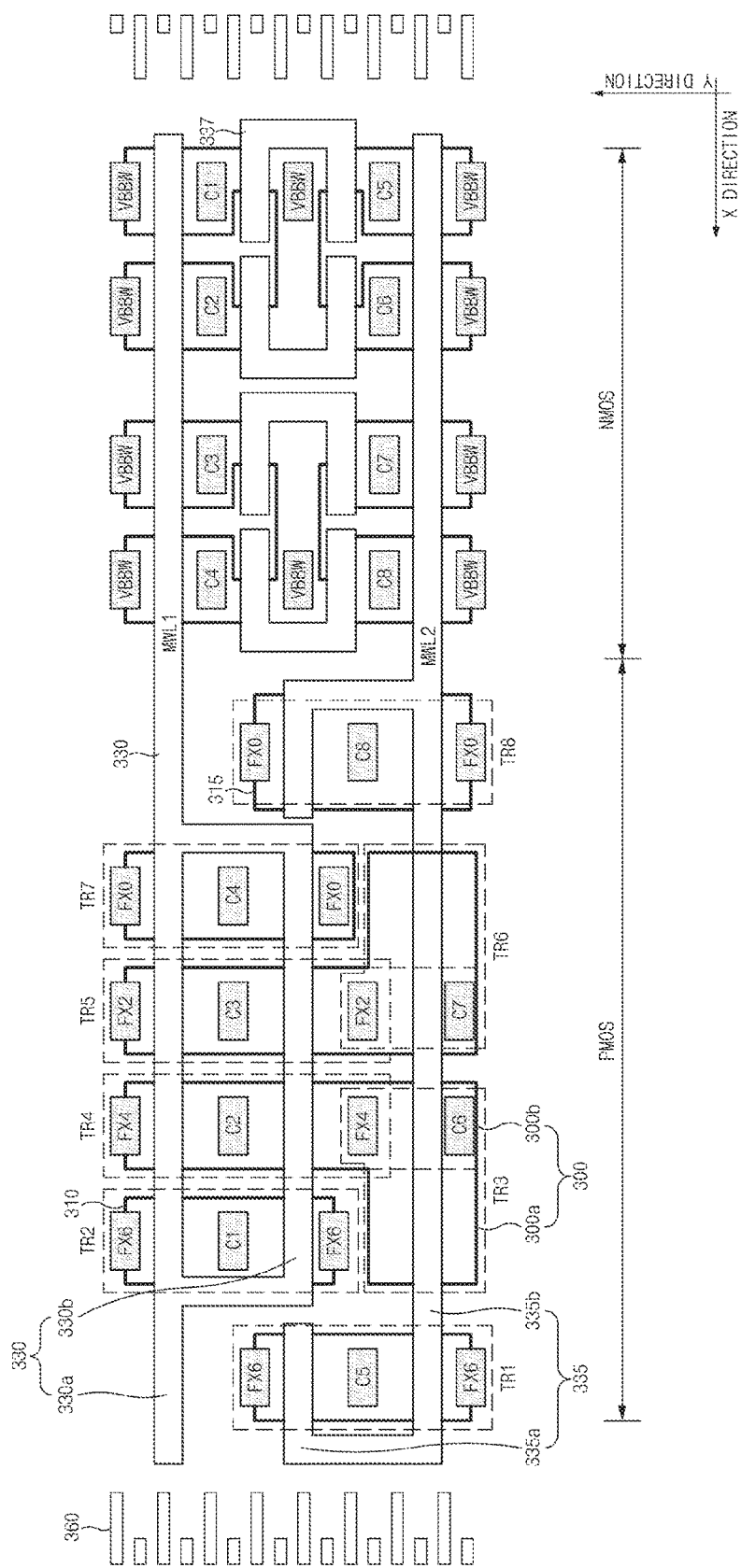

FIGS. 5A to 5C are layout diagrams illustrating a sub wordline driver (SWD) according to another embodiment of the present disclosure.

The sub wordline driver (SWD) may include a PMOS region and an NMOS region, and each of the PMOS region and the NMOS region may include a plurality of active regions, a plurality of main word lines, and a plurality of metal contacts.

FIG. 5A illustrates the active regions arranged in the sub wordline driver (SWD), and the shape and arrangement structure of the active regions will hereinafter be described with reference to FIG. 5A.

The plurality of active regions arranged in the PMOS region may include a first active region 300, a second active region 310, and a third active region 315, which are spaced apart from one another by a predetermined distance to make one pair of active regions. The separation distance among the first active region 300, the second active region 310, and the third active region 315 is not limited thereto, and different distances may also be used in respective separation parts without departing from the scope or spirit of the present disclosure.

The first active region 300 may include a first portion 300a having a first critical dimension W1, and a second portion 300b having a second critical dimension W2 smaller than the first critical dimension W1, such that the first active region 300 may be formed in a connection shape of the first portion 300a and the second portion 300b. In this case, one side of the first portion 300a and one side of the second portion 300b in the first active region 300 may be arranged at the same line extended in the first direction (X direction). That is, one side of each of the first and second portions (300a, 300b) may be shaped in a '┐' or '└' shape as shown in FIG. 5A.

The second active region 310 may be formed to have a third critical dimension W3 smaller than the first critical dimension W1. The third critical dimension W3 may be formed to be larger than the second critical dimension W2 of the second portion 300b of the first active region 300.

The third active region 315 may be formed to have a fourth critical dimension W4 larger than the second critical dimension W2.

In this case, the first critical dimension W1 and the second critical dimension W2 of the first active region 300, the third critical dimension W3 of the second active region 310, and the fourth critical dimension W4 of the third active region 315 may indicate a critical dimension of the second direction (Y direction) shown in FIG. 5A.

The first active region 300, the second active region 310, and the third active region 315 are spaced apart from one another by a predetermined distance. The second active region 310 may be adjacent to the first portion 300a of the first active region 300 in the first direction (X direction), and may be adjacent to the second portion 300b of the first active region 300 in the second direction (Y direction). That is, the second active region 310 may be arranged in a angled portion of the first active region 300.

Assuming that the first active region 300 and the second active region 310 make one pair A1 of active regions, one pair A1 of the active regions may be spaced apart from the other pair A2 of active regions by a predetermined distance. In addition, one pair A1 of active regions and the other pair A2 of active regions adjacent to the active regions A1 may be symmetrically arranged in up, down, left and right directions, and a vertical direction or a horizontal direction.

The third active region 315 may be arranged on one side of the portion 'A1' including the first active region 300 and the second active region 310, and may be arranged on the other side of the portion 'A2'. That is, the third active region 315 may be disposed at an outer wall of the PMOS region.

The arrangement structure of active regions is not limited thereto, and the active regions can be freely arranged in a predetermined range which takes-up same-sized region.

Meanwhile, a plurality of fourth active regions 320, each of which has a first critical dimension W1, may be spaced apart from each other by a predetermined distance in the first direction (X direction), such that the NMOS region is achieved. Two fourth active regions 320 adjacent to each other may be interconnected at the center part.

FIG. 5B is a layout diagram illustrating a plurality of main word lines (MWL) disposed over the active regions shown in FIG. 5A.

Referring to FIG. 5B, a plurality of main word lines (MWL) may be disposed to pass through the first active region 300, the second active region 310, and the third active region 315 of the PMOS region and the fourth active region 320 of the NMOS region. The main word lines (MWL) may be formed in a line shape extended in the first direction (X direction). The plurality of main word lines (MWL) may include a first main word line (MWL1; 330) and a second main word line (MWL2; 335).

Each of the first main word line 330 and the second main word line 335 may be formed in a fingered structure of one or two gate lines.

The first main word line 330 and the second main word line 335 may include both a fingered portion of one gate line and a fingered portion of two gate lines.

Since three gate lines of the embodiment are arranged to pass through the sub wordline driver (SWD) region, a total number of gate lines formed in a fingered shape in the first main word line 330 and the second main word line 335 located at the same column may be set to three.

A relationship among the main word lines and the gate lines will hereinafter be described with reference to 'A' and 'B' of FIG. 5B.

Referring to 'A' of FIG. 5B, assuming that one first gate line 330a is formed in a fingered shape in the first main word line 330 on a same column, the second main word line 335 may be arranged in a manner such that two gate lines (i.e., a first gate line 335a and a second gate line 335b) are formed in a fingered shape.

Referring to 'B' of FIG. 5B, assuming that two gate lines (i.e., a first gate line 330a and a second gate line 330b) are formed in a fingered shape in the first main word line 330, the second main word line 335 may be arranged such that one first gate line 330a is formed in a fingered shape. In this case, the fingered portions of the first gate line 330a and the second gate line 330b may be interconnected at a specific position (see 'C' of FIG. 5B) at which only the first gate line 330a is arranged. Further, the first portion 300A of the first active region 300 may be arranged in a manner that three gate lines (330A, 335A, 335B) pass through the first portion 300A.

In addition, the second main word line 335 may be arranged such that two gate lines (i.e., the first gate line 335a and the second gate line 335b) are formed in a fingered shape at both ends (i.e., the arrangement portion of the third active region 315) of the PMOS region.

One gate line may be formed in a fingered shape in a predetermined portion of the first main word line 330 and the second main word line 335, and two gate lines may be formed in a fingered shape in another portion thereof.

Since two gate lines are formed in a fingered shape in each of two main word lines according to the related art, a total of four gate lines may be arranged to pass through one sub wordline driver (SWD).

However, since one or two gate lines are formed in a fingered shape in two main word lines according to the embodiment, a total of three gate lines may be arranged to pass through one sub wordline driver (SWD). Therefore, it may be possible to guarantee a space between gate lines and metal contacts to be arranged in a subsequent process.

The first main word line (MWL1; 330) and the second main word line (MWL2; 335) arranged to pass through the fourth active region 320 may also be contained in the NMOS region. The first main word line 330 and the second main word line 335 in the NMOS region may be extended from the first main word line 330 and the second main word line 335 of the PMOS region, respectively.

In addition, the '⊏'-shaped word line 337 may be added between the first main word line 330 and the second main word line 335 of the NMOS region. The word lines 337 may be spaced apart from each other a predetermined distance in the first direction (X direction), and two neighbor word lines 337 may be horizontally symmetrical to each other.

FIG. 5C is a layout diagram illustrating a plurality of metal contacts added to the layout diagram of FIG. 5B.

Referring to FIG. 5C, a plurality of metal contacts may be arranged over the first active region 300 and the second active region 310 located at both sides of the first gate line 330a and the second gate line 330b of the first main word line 330.

The plurality of metal contacts will hereinafter be described in detail. A metal contact C1, a metal contact C2, a metal contact C3, and a metal contact C4 may be arranged on one side of the first gate line 330a of the first main word line 330. In addition, a metal contact FX6, a metal contact FX4, a metal contact FX2, and a metal contact FX0 may be arranged to respectively correspond with the metal contact C1, the metal contact C2, the metal contact C3, and the metal contact C4 on the basis of the first gate line 330a of the first main word line 330.

In addition, a metal contact C5, a metal contact C6, a metal contact C7, and a metal contact C8 may be arranged on one side and the other side of the second gate line 335b of the second main word line 335. In addition, a metal contact FX6, a metal contact FX4, a metal contact FX2, and a metal contact FX0 may be arranged to respectively correspond to the metal contact C5, the metal contact C6, the metal contact C7, and the metal contact C8 on an opposite side of the second gate line 335b of the second main word line 335.

In addition, the metal contact FX0 and the metal contact FX6 may be arranged on one side of the second gate line 330b of the first main word line 330 passing through the second active region 310, and may also be arranged on the other side of the second gate line 335b of the second main word line 335.

The metal contacts (C1~C8) may be coupled to respective sub word lines 360, and the metal contacts (FX0~FX6) may be coupled to output signals of the sub word lines. Although the connection relationship between sub word lines and metal contacts will herein be omitted to more clearly illustrate arrangement of the gate lines for convenience of description, the sub word lines 360 may be arranged to respectively connect to metal contacts (C1~C8). In one example, at least one metal contact (C1~C8, FX0~FX6) may be disposed over a first active region 300 arranged at both sides of the three gate lines 330A, 330B, 335B. In another example, at least one metal contact (C1~C8, FX0~FX6) may be disposed over a first active region 300 arranged at both sides of three different gate lines 330A, 335A, 335B.

A total of eight transistors may be arranged in the sub wordline driver (SWD), and some of the eight transistors may share a metal contact and thus serve as a transistor.

For example, a first transistor TR1 may include a metal contact C5 and a metal contact FX6 arranged at both sides of the first gate line 335a and the second gate line 335b of the second main word line 335 passing through the third active region 315.

A second transistor TR2 may include a metal contact C1 and a metal contact FX6 arranged at both sides of the first gate line 330a and the second gate line 330b of the first main word line 330 passing through the second active region 310.

A third transistor TR3 may include a second gate line 335b of the second main word line 335 passing through the first active region 300, and a metal contact C6 and a metal contact FX4 arranged at both sides of the second gate line 335b.

A fourth transistor TR4 may include a metal contact C2 and a metal contact FX4, which are arranged at both sides of the first gate line 330a and the second gate line 330b of the first main word line 330 passing through the first active region 300. In this case, the third transistor TR3 and the fourth transistor TR4 may share the metal contact FX4 disposed between the first main word line 330 and the second main word line 335.

A fifth transistor TR5, a sixth transistor TR6, a seventh transistor TR7, and an eighth transistor TR8 may include the same constituent elements as the first to fourth transistors (TR1~TR4), and as such a detailed description thereof will herein be omitted for convenience of description.

In addition, the NMOS region may include metal contacts (VBBW) and metal contacts (C1~C8) disposed at both sides of the first main word line 330 and the second main word line 335. Further, additional metal contacts (VBBW) may also be arranged in the word line 337 located between the first main word line 330 and the second main word line 335.

As described above, the conventional sub wordline driver (SWD) structure through which four gate lines pass is modified into another sub wordline driver (SWD) structure through which three gate lines pass, such that a larger-sized space between gate lines and metal contacts can be guaranteed as compared to the conventional sub wordline driver (SWD) structure.

As is apparent from the above description, the embodiments in which three gate lines are formed to pass through a sub wordline driver (SWD) may have the following effects.

First, the embodiments can ensure a space between a gate line and metal contacts.

Second, since the space between the gate line and the metal contacts is increased, embodiments can prevent the occurrence of a closed state of metal contacts, resulting in improvement of device characteristics.

Those skilled in the art will appreciate that embodiments of the present disclosure may be carried out in other ways than those set forth herein without departing from the scope and characteristics of these embodiments. The above embodiments are therefore to be construed in all aspects as illustrative and not restrictive.

The above embodiments of the present disclosure are illustrative and not limitative. Various alternatives and equivalents are possible. The invention is not limited by the type of deposition, etching polishing, and patterning steps described herein. Nor are embodiments limited to any specific type of semiconductor devices. For example, embodiments may be implemented in a dynamic random access memory (DRAM) device or non volatile memory device. Other additions, subtractions, or modifications are obvious in view of the present disclosure and are intended to fall within the scope of the appended claims.

What is claimed is:

1. A semiconductor memory device layout having a sub wordline driver in which a PMOS region is located comprising:
    a first main word line having a first gate line and a second gate line; and
    a second main word line having a third gate line and a fourth gate line,
    wherein the fourth gate line is extended from the third gate line to form a line, and
    wherein the second gate line and the fourth gate line are disposed in a line.

2. The semiconductor memory device layout according to claim 1, wherein the first main word line is formed to diverge into the first gate line and the second gate line.

3. The semiconductor memory device layout according to claim 1, further comprising:
    a first active region in which a first portion having a first critical dimension is coupled to a second portion having a second critical dimension smaller than the first critical dimension; and
    a second active region having a third critical dimension,
    wherein the first critical dimension, the second critical dimension, and the third critical dimension indicate a critical dimension of a second direction perpendicular to an extended direction of the main word line.

4. The semiconductor memory device layout according to claim 3, wherein the first active region and the second active region are spaced apart from each other by a predetermined distance so as to make one pair of active regions,
    wherein the second active region is adjacent to the first portion of the first active region in a first direction, and the second active region is adjacent to the second portion of the first active region in a second direction.

5. The semiconductor memory device layout according to claim 4, wherein:
    in association with one pair of active regions including the first active region and the second active region and the other pair of active regions adjacent to the pair of the first and second active regions, the first active region and the second active region are symmetrically arranged in up, down, left and right directions, in a vertical direction, or in a horizontal direction.

6. The semiconductor memory device layout according to claim 5, further comprising:
    a third active region having a fourth critical dimension larger than the second critical dimension, configured to be arranged not only on one side of the one pair of active regions but also on the other side of the other pair of active regions.

7. The semiconductor memory device layout according to claim 3, wherein the first portion of the first active region is arranged in a manner that three gate lines pass through the first portion.

8. The semiconductor memory device layout according to claim 7, wherein a metal contact is disposed over the first active region arranged at both sides of the three gate lines.

9. The semiconductor memory device layout according to claim 8, wherein the first active region includes two transistors.

10. The semiconductor memory device layout according to claim 9, wherein the two transistors share the metal contact arranged over the first active region disposed between the first main word line and the second main word line.

11. The semiconductor memory device layout according to claim 6, wherein the second active region and the third active region are arranged in a manner that two gate lines pass through the second and third active regions.

12. The semiconductor memory device layout according to claim 11, wherein a metal contact is arranged at both sides of the two gate lines of the second active region and the third active region.

13. A semiconductor memory device layout having a sub wordline driver in which a PMOS region is located comprising:
- a first main word line having a first gate line and a second gate line;
- a second main word line having a third gate line and a fourth gate line;
- a first active region passed through by the first main word line and the second main word line; and
- a second active region passed through by the first main word line or the second main word line.

14. The semiconductor memory device layout according to claim 13, wherein the first active region, the first main word line and the second main word line are formed to make two transistors coupled to two sub word lines.

15. The semiconductor memory device layout according to claim 13, wherein the second active region and the first main word line or the second main word line are formed to make one transistor coupled to one sub wordline.

16. The semiconductor memory device layout according to claim 13, wherein the first main word line is formed to diverge into the first gate line and the second gate line.

17. The semiconductor memory device layout according to claim 16, wherein the fourth gate line is extended from the third gate line to form a line.

18. The semiconductor memory device layout according to claim 17, further comprising;
- a fifth gate line diverged from the third gate line.

19. The semiconductor memory device layout according to claim 13, wherein the second gate line and the fourth gate line are disposed in a line.

20. The semiconductor memory device layout according to claim 1, further comprising;
- a fifth gate line diverged from the third gate line.

\* \* \* \* \*